SWITCHING CIRCUIT

Filed Aug. 19, 1966

Inventor:
FREDERICK O. BARTHOLOMEW
By John V. Regan
Attorney

United States Patent Office 3,509,362

Patented Apr. 28, 1970

3,509,362
SWITCHING CIRCUIT

Frederick O. Bartholomew, Blackwood, N.J., assignor to RCA Corporation, a corporation of Delaware Filed Aug. 19, 1966, Ser. No. 573,529
Int. Cl. H03k 19/08
U.S. Cl. 307—203 3 Claims

ABSTRACT OF THE DISCLOSURE

A current mode switch circuit comprising first and second transistors having their respective emitter electrodes coupled together and to a source of operating potential and their collector electrodes coupled through first and second impedance means, respectively, to a reference potential. At least one third transistor responsive to binary input signals having high and low voltage levels and means for coupling the emitter and collector electrodes, respectively, of said third transistor to the base electrodes of said first and second transistors, respectively, such that the switching speed of the switch is increased.

Current mode switching circuits are well suited for high speed digital systems, for example electronic computers and other electronic apparatus, since the transistors therein can be operated out of saturation with relatively small voltage swings which may be on the order of a fraction of a volt or so. The avoidance of transistor saturation and the small voltage excursions enable current mode switching circuits to have a high speed of response.

One type of current mode switching circuit includes at least two transistors having separate collector circuits and a common emitter circuit in which a current source is connected. The current source current can be routed through either one of the alternate current paths provided by the collector-to-emitter paths of the transistors by application of a suitable difference in potential between the base electrodes thereof. When this type of current mode switching circuit is utilized as a logic gate, the difference in potential is achieved by applying relatively high (HI) and relatively low (LO) binary signal voltage levels to one transistor base electrode and a reference voltage ($V_{ref.}$) to the other transistor base electrode. A value intermediate the HI and LO signal levels is assigned to $V_{ref.}$, so that the potential difference between the two signal levels and $V_{ref.}$ controls which of the transistors the current is routed through. This type of logic gate is sometimes called a current mode logic (CML) gate.

In the usual type CML gate the voltage $V_{ref.}$ is a fixed voltage whereby the differential switching voltage is determined simply by the difference between $V_{ref.}$ and the HI and LO input signal levels. The present invention is directed to novel improvements in CML gates whereby the differential switching voltage is in the form of an overdrive to the gate thereby improving, inter alia, the switching speed and the D.C. noise margin while reducing the circuit complexity and power dissipation and retaining temperature and power supply tracking.

An object of the present invention is to provide novel and improved current mode switching circuits.

Another object is to provide a novel and improved current mode logic circuit.

In accordance with an illustrated example of the present invention, a signal translating means responds to binary input signals to provide overdrive signals to a current mode switch. The signal translating means includes an inverting type amplifier with a gain G for inverting the binary signals and additionally includes means for applying the binary signals and the inverted binary signals to first and second current mode switch inputs, respectively, such that the differential signal swing between the current mode switch inputs is $(1+G)$ multiplied by the binary input signal swing. In a preferred form of the invention, the inverting amplifier is embodied as a transistor operated in the paraphase mode to provide inverted and noninverted binary signals at its collector and emitter electrodes, respectively, in response to the binary input signals. Suitable circuit means is provided to couple the emitter and collector electrodes of the transistor to the first and second inputs of the current mode switch, respectively.

Figure 1:
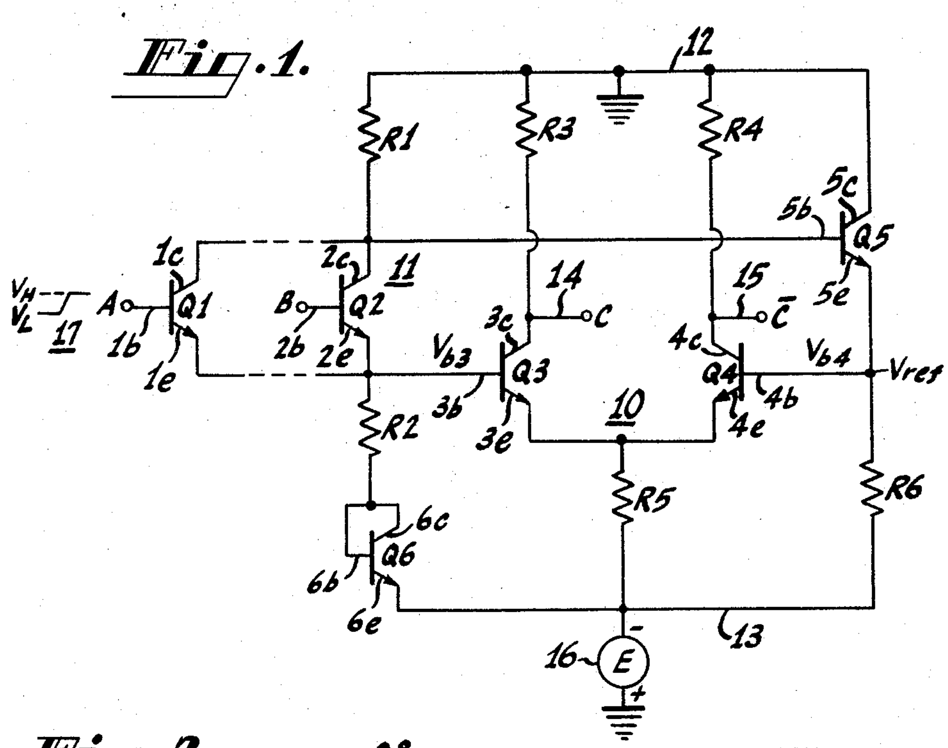
FIG. 1 is a schematic circuit diagram of an exemplary current mode switch according to the present invention.

Referring now to FIG. 1, there is illustrated a current mode switching circuit which includes current mode switch 10 and a signal translating circuit 11 with each being connected to a pair of supply connections 12 and 13. The current mode switch 10 includes a pair of transistors Q3 and Q4 having their emitter electrodes 3*e* and 4*e* connected in common and by way of a common emitter resistor R5 to the supply connection 13. The collector electrodes 3*c* and 4*c* are connected by way of resistors R3 and R4, respectively, to the supply connection 12. The collector electrodes 3*c* and 4*c* are further connected to outputs 14 and 15, respectively, at which complementary output signals C and $\overline{C}$, respectively, are developed. The base electrodes 3*b* and 4*b* are connected to the emitter electrodes 2*e* and 5*e* of the transistors Q2 and Q5, respectively, of the signal translating circuit 11.

The signal translating circuit 11 includes at least one inverting type amplifier illustrated as a transistor Q2 connected for operation in the paraphase mode. To this end, the base electrode 2*b* is connected to receive binary input signals B.

The emitter electrode 2*e* is connected by way of resistor R2 and a temperature compensating and power supply tracking means Q6 to the supply connection 13. Temperature compensating means Q6 is illustrated as a transistor having its base electrode 6*b* and its collector electrode 6*c* connected in common to the resistor R2 and its emitter electrode 6*e* connected to the supply connection 13. Although the temperature compensating means Q6 is illustrated as a transistor, it should be apparent that a semiconductor diode or other PN junction device could be employed. In fact, the temperature compensating means Q6 is necessary only when the circuit is intended to have reliability over a wide temperature range over wide variations of the power supply, and may be omitted when reliability is needed only over a small temperature range and where the power supply is relatively stable.

The collector electrode 2*c* is coupled by way of a resistor R1 to the supply connection 12. The collector electrode 2*c* is further connected to the base electrode 5*b* of a transistor Q5 connected in the emitter follower configuration. The collector electrode 5*c* is connected to the supply connection 12 and the emitter electrode 5*e* is connected by way of a resistor R6 to the supply connection 13.

Additional inputs to the current mode switching circuit may be provided by connecting the collector and emitter electrodes of additional transistors in parallel with the collector electrode 2*c* and emitter electrode 2*e* of transistor Q2. For example, as illustrated by the dashed connections, further transistors Q1 has its collector electrode 1*c* connected to collector electrode 2*c* and its emitter electrode 1*e* connected to the emitter electrode 2*e*. The base electrode 1*b* is connected to receive further binary input signals A.

The current mode switching circuit thus far described may be fabricated as an article in integrated circuit structures or modules. In fact, an array of the above-described circuits may be fabricated in a single chip of semiconductor material and interconnected to perform various logical and switching functions which might be required by a particular digital system. However, the above-described circuit may also be fabricated with discrete components.

For use in an electrical circuit, a suitable source 16 of operating voltage of value E is connected between the supply connections 12 and 13. For the illustrated NPN type transistors, the source 16 has its negative terminal connected to the supply connection 13 and its positive terminal connected to the supply connection 12, with the supply connection 12 being arbitrarily connected to a suitable reference potential, illustrated as circuit ground by the conventional symbol. It should be apparent that when PNP type transistors are utilized in the current mode switching circuit the polarity of the source 16 would be reversed.

The binary signals A and B have the well-known form of HI and LO voltage levels with transitions therebetween as illustrated by the waveform 17 at the base electrode 1*b* in FIG. 1. As there illustrated, the HI and LO voltage levels are considered to have values of $V_H$ and $V_L$. These signals A and B may be derived, e.g., from the outputs of similar current mode switching circuits connected in the digital system.

The common emitter resistor R5 and the voltage source 16 simulate a source of current for the current mode switch 10. When the base voltage $V_{b3}$ at base electrode 3*b* is more positive than the base voltage $V_{b4}$, transistor Q3 is turned on and transistor Q4 is turned off, whereby the current source current is routed through the collector-to-emitter path of transistor Q3 and resistor R3 and the outputs C and $\overline{C}$ are at the LO and HI levels, respectively. When $V_{b4}$ is more positive than $V_{b3}$, transistor Q4 is turned on and transistor Q3 is turned off such that the source current is routed through the collector-to-emitter path of transistor Q4 and the outputs C and $\overline{C}$ are at the HI and LO levels, respectively.

Transistor Q3 is turned on to provide a current path when either or both of the binary signals A and B is at the HI voltage level. The HI level of either singal A or B is translated with level shift by the base-emitter junction of the transistor Q1 or Q2, as the case may be, to the base electrode 3*b* of transistor Q3. In addition, the transistor Q1 or Q2 inverts the binary signal A or B with a gain G; and the inverted binary signal is translated with level shift by the base-emitter junction of transistor Q5 to the base electrode 4*b* as a LO level signal modified by the gain G. Thus, $V_{b3}$ is more positive than $V_{b4}$ for this condition, whereby transistor Q3 is turned on and transistor Q4 is turned off. The outputs C and $\overline{C}$ are at the LO and HI levels, respectively.

The transistor Q4 is turned on to provide a current path only when both of the binary signals A and B are at the LO level. The LO level of the signals A and B is translated with level shift by the base-emitter junctions of the transistors Q1 and Q2 to the base electrode 3*b* of transistor Q3. In addition, the transistors Q1 and Q2 invert the LO signal level of the binary signals A and B with a gain G; and the inverted binary signal level is translated with level shift by the base-emitter junction of transistor Q5 to the base electrode 4*b* as a HI level signal modified by the gain G. Thus, $V_{b4}$ is more positive than $V_{b3}$ for this condition, whereby transistor Q4 is turned on and transistor Q3 is turned off. The outputs of C and $\overline{C}$ are in the HI and LO, levels, respectively.

In summary, whenever either or both of the input signals A and B is at the HI level, the output C is at the LO level. It is only when both binary input signals A and B are at the LO level that the output signal C is at the HI level. Of course, the output signal $\overline{C}$ is the complement of the output signal C in each of the above cases. If the binary symbols "1" and "0" are assigned to the HI and LO levels, respectively, the circuit can be said to function as a NOR gate with respect to the output signal C and as an OR gate with respect to the output signal $\overline{C}$. On the other hand, if the binary symbols "1" and "0" are assigned to the LO and HI levels, respectively, the circuit can be said to function as a NAND gate with respect to the output signal C and as an AND gate with respect to the output signal $\overline{C}$.

It is evident from the foregoing description that the present invention departs from the prior art practice of maintaining $V_{b4}$ (also designated $V_{ref.}$) at a fixed voltage relative to the ground reference. This departure enables the current mode switch 10 to be driven with an overdrive signal in the push-pull mode to speed up the switching action of the circuit. The overdrive or push-pull signal results since both $V_{b3}$ and $V_{b4}$ experience signal swings in opposing directions during the switching transients. On the one hand, $V_{b3}$ experiences the total swing $V_H-V_L$ since the transistors Q1 or Q2 merely shift the level of the input signals A or B. On the other hand, $V_{b4}$ experiences an inverted signal swing of $G(V_H-V_L)$ due to the inversion and amplification of transistors Q1 or Q2. Thus, the total differential switching signal is $$(V_{b3}-V_{b4})=(1+G)(V_H-V_L).$$

The circuit is preferably designed so that the average of $V_{b4}$ is midway between the signal levels of $V_{b3}$ in order to provide a switching threshold for the circuit which is midway between the input voltage levels. In addition, when temperature compensation is a requirement, the circuit is preferably designed so that the average currents in the R2 circuit branch and the R6 circuit branch are equal. This procedure assures a second order effect of temperature tracking, in that the absolute values of the $V_{BE}$ drops of transistors Q1, Q2, Q5, and Q6 will tend to be identical when all device geometries are identical. Thus, differences in $V_{BE}$ due to temperature changes will track (first order effect), and absolute values of $V_{BE}$ will tend to be identical at any one temperature (second order effect).

Figure 4:
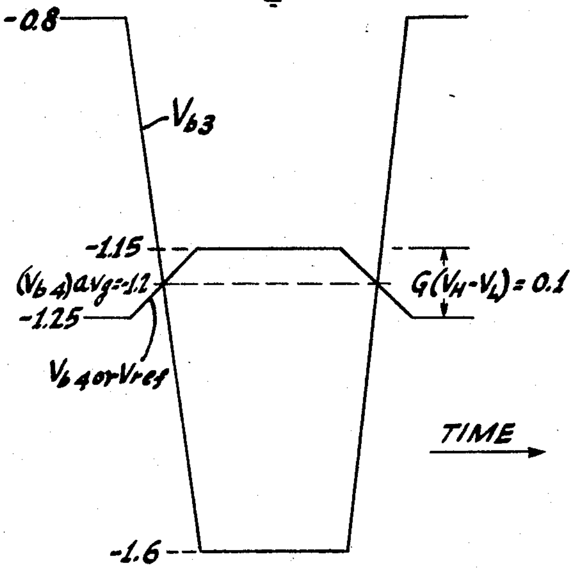
FIG. 4 is a graphical display of the voltage waveforms occurring at the two current mode switch inputs superimposed upon one another.

FIG. 4 illustrates superimposed voltage signal waveforms for $V_{b3}$ and $V_{b4}$ where $V_H=0$ volt, $V_L=-0.8$ volt, $V_{BE}$ (base-emitter junction voltage drop)=0.8 volt, $G=0.125$ and $E=5.2$ volts. The choice of these values is purely arbitrary and should in no way be taken as limiting.

In FIG. 4, $V_{b3}$ has a total swing of 0.8 volt from −0.8 volt to −1.6 volts; and $V_{b4}$ has a total swing of 0.1 volt from −1.15 volts to −1.25 volts. During the switching transients the time rates of change of $V_{b3}$ and $V_{b4}$ are such that $V_{b3}=V_{b4}$ at −1.2 volts which is midway between the signal levels of both $V_{b3}$ and $V_{b4}$. Thus, for the illustrated set of values the current mode switch 10 has a threshold of −1.2 volts; while the entire current mode switching circuit has a threshold of −0.4 volt midway between the input signal levels.

Figure 2:
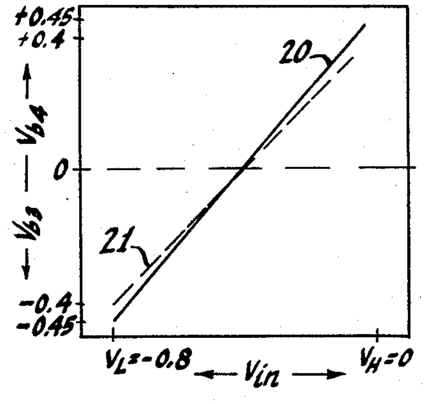
FIG. 2 is a graphical display of the current mode switch differential input signal plotted against the input voltage for the circuit of FIG. 1.

The differential signal applied to the current input switch 10 is the difference of the waveforms in FIG. 4 or $V_{b3}-V_{b4}$. This difference signal is plotted as solid line curve 20 in the display of FIG. 2 as a function of the input voltage $V_{in}$, that is, as a function of those combinations of the binary signals A and B which cause the circuit to switch. The solid line curve 20 in FIG. 2 is seen to swing during the switching transients between 0.45 volt and −0.45 volt for a total swing of 0.9 volt. The dashed line curve 21 is illustrative of the differential signal for a similar CML circuit having a fixed or constant value $V_{b4}$ or $V_{ref.}$. This curve 21 is seen to swing between 0.4 volt and −0.4 volt for a total swing of 0.8 volt. Thus, the push-pull driving of the present invention provides a differential switching signal which is larger than that of a similar CML circuit with a fixed $V_{ref.}$ by the value $G(V_H-V_L)$ of the signal applied to the base electrode of 4*b*.

Figure 3:
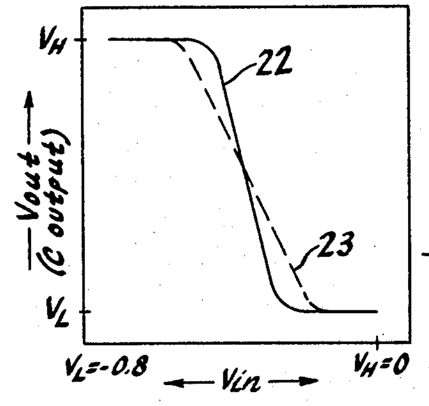
FIG. 3 is a graphical display of the D.C. transfer characteristic for the circuit of FIG. 1.

This switching action of the present invention may be described as an "open loop feedback" of such manner that the D.C. transfer curve is somewhat sharper than that of a similar CML circuit with a constant value $V_{ref.}$; but yet no hysteresis is produced. The solid line curve 22 in the display of FIG. 3 illustrates the D.C. transfer curve for the output C of the present CML circuit compared to the dashed line of D.C. transfer curve 23 for a similar CML circuit with a fixed $V_{ref.}$. The increased sharpness of the curve 22 reflects the overdrive switching signal and increased switching speed of the present invention. In addition, the improved D.C. noise margin of the present invention is reflected by curve 22 since changes of the output voltage $V_{out}$ require larger changes of the input voltage $V_{in}$ as compared to curve 23.

The circuit complexity of the present invention is somewhat reduced over that of similar CML circuits where a fixed $V_{ref.}$ is driven from an emitter follower transistor since voltage divider means is additionally required for the base circuit of the emitter follower. In addition, power dissipation is somewhat less since only the current in emitter resistor R6 is added to achieve the $V_{ref.}$ of the present invention; whereas at least two additional currents are required for the emitter follower with a voltage divider for its base circuit.

As mentioned previously, $G=R1/R2$ and the value thereof is somewhat dependent upon the proper biasing of transistors Q1 and Q2. Thus when the circuit is utilized with a single power supply as illustrated in FIG. 1, the range of values for G is limited by considerations for the saturation of transistors Q1 and Q2. However, it should be apparent that by providing separate bias source means for transistors Q1 and Q2, the range of values of G could be increased without encountering saturation of transistors Q1 and Q2. Another example of a technique for increasing the range of values of G is to provide additional series diodes in the R2 and Q6 circuit branch, in lieu of using an external bias source for transistors Q1 and Q2. However, this not only adds complexity to the circuit, but also tends to upset the temperature tracking feature.

It should be further noted that transistors Q1 and Q2 reduce the input capacitance of the CML gate of the present invention. These transistors operate as emitter followers with respect to the base electrode 3*b* and thereby tend to reduce the base to collector capacitance and other capacitance of the switching transistor Q3 by a factor of $\beta$ as seen at the circuit input. Consequently, faster switching speeds and larger fan ins are possible without degrading the switching performances of other similar CML gates which supply the signals A and B.

The invention is illustrated can also be provided with emitter follower circuits connected to the circuit outputs 14 and 15, if desired. However, such a connection would require additional level shift means connected between the collector electrode 2*c* and the base electrode 4*b*. For example, the additional level shift means might take the form of a PN junction of a semiconductive device, such as a transistor or a diode, connected between the emitter electrode 5*e* and the base electrode 4*b*.

What is claimed is:

1. The combination of:

a switch circuit comprising:

two transistors, each having a control electrode, an input electrode and an output electrode;

a common load resistor connected at one terminal to both input electrodes;

two load impedances; and terminals for a power supply, one connected to the other terminal of said resistor and the other coupled through the respective impedances to the respective output electrodes; and a circuit for controlling said switch comprising;

two current paths coupled between said terminals, each said path including an active element and an impedance;

means for applying to the active element of one path a control signal in a sense to increase the current flow therethrough and to the active element of the other path a control signal in a sense to decrease the current flow therethrough; and means for direct coupling from a point in one path to the control electrode of one transistor and from a point in the other path to the control electrode of the other transistor, at points in the respective paths such that $$\frac{V_{max.}-V_{min.}}{2}$$

is the same for both transistors, whereby $V_{max.}$ is the maximum voltage applied to the control grid of a transistor and $V_{min.}$ is the minimum voltage applied to the control grid of the same transistor.

2. A current mode logic circuit responsive to at least one input binary signal which swings between first and second voltage levels and has relatively steep leading and lagging edges, the combination comprising:

a current mode switch having first and second inputs and at least one output;

at least one signal translating means having a gain G, operable in response to said binary signals to produce two output signals, the first output signal having a voltage swing in phase with the difference between said first and second voltage levels and the second output signal having a voltage swing which is the inversion of the difference between said first and second voltage levels multiplied by said gain G;

first means for direct coupling said first output signal to said first input of said current mode switch;

second means for direct coupling said second output signal to said second input of said current mode switch, whereby the switching speed of said switch is substantially increased; and said second means including means for maintaining said second input signal at an average voltage level which is midway between the voltage levels of said first input signal.

3. The combination comprising:

first and second transistors each having base, collector and emitter electrodes;

a source of operating potential having first and second output terminals;

means for connecting said emitter electrodes together and means for coupling them to said first output terminals of said source;

means for coupling said collector electrodes of said first and second transistors, respectively, to said second output terminal;

at least one third transistor having base, collector and emitter electrodes;

first means for direct coupling said emitter electrode of said third transistor to the base electrode of said said second transistor;

second means for direct coupling the collector electrode of said third transistor to the base electrode of said second transistor;

said second means comprising a fourth transistor having base, collector, and emitter electrodes;

means for direct coupling the base electrode of said fourth transistor to the collector electrode of said third transistor;

means for direct coupling the emitter electrode of said fourth transistor to the base electrode of said second transistor; and means for applying a binary signal having first and second voltage levels to the base electrode of said third transistor.

References Cited

UNITED STATES PATENTS

| | | | |
|---|---|---|---|
| 2,521,878 | 9/1950 | Starr | 330—69 |
| 3,259,761 | 7/1966 | Narud et al. | 307—203 |

JOHN S. HEYMAN, Primary Examiner

B. P. DAVIS, Assistant Examiner

U.S. Cl. X.R.

307—207, 296, 218